United States Patent [19]

Lagarde

[11] 3,842,413

[45] Oct. 15, 1974

[54] ANALOG-DIGITAL CONVERTER OF THE RE-CIRCULATION TYPE

[75] Inventor: Jean-Louis Lagarde, Arpajon, France

[73] Assignee: Compagnie Industrielle Des Telecommunications Cit-Alcatel, Paris, France

[22] Filed: Nov. 17, 1972

[21] Appl. No.: 307,369

[30] Foreign Application Priority Data

Nov. 17, 1971 France .............................. 71.41171

[52] U.S. Cl.... 340/347 AD, 235/92 CA, 235/92 SH

[51] Int. Cl. .......................................... H03k 13/00

[58] Field of Search......... 340/347 AD; 235/92 CA, 235/92 SH

[56] References Cited

UNITED STATES PATENTS

| | | | |
|---|---|---|---|
| 2,660,618 | 11/1953 | Algrain | 340/347 AD |
| 2,832,827 | 4/1958 | Metzger | 340/347 AD |
| 3,170,153 | 2/1965 | Brooks | 340/347 AD |
| 3,276,012 | 9/1966 | Secretan | 340/347 AD |
| 3,460,131 | 8/1969 | Gorbatenko et al. | 340/347 AD |
| 3,703,002 | 11/1972 | Van Saun | 340/347 AD |
| 3,737,892 | 6/1973 | Dorey | 340/347 AD |
| 3,747,089 | 7/1973 | Sharples | 340/347 AD |

*Primary Examiner*—Malcolm A. Morrison
*Assistant Examiner*—Errol A. Krass
*Attorney, Agent, or Firm*—Craig & Antonelli

[57] ABSTRACT

Analog-to-digital convertor of the re-circulation type converting an analog magnitude, for example a voltage sampled at regular intervals, from a telephone current, into a series of coded quantification pulses in binary code, the convertor operating as a compression law coder, possibly as a linear coder.

13 Claims, 2 Drawing Figures

ANALOG-DIGITAL CONVERTER OF THE RE-CIRCULATION TYPE

The invention concerns a convertor which, receiving an analog magnitude, for example, a voltage sampled at regular intervals from a telephonic current, supplies a series of coded quantification pulses in binary code. It concerns such a convertor of the re-circulating type operating as a compression law coder.

In a standard compression law coder, the coding characteristic comprises several rectilinear sections whose slopes decrease in a geometrical progression in a proportion of 1:2:- p, p/2, p/4, p/8, p/16, p/32, p/64. Each section is subdivided into a same number of steps which are equal to one another, for example 16 steps. Exceptionally, the first two sections, whose order numbers are 0 and 1, have the same slope and are aligned in the same direction. The complete characteristic comprises eight sections for the positive levels and eight sections for the negative levels. The complete code comprises three bits (A, B, C) showing the order number of the section, between 0 and 7, four position bits (DEFG) showing the position, in the order section ABC, and one sign bit, S.

Coders of the re-circulating type comprising an amplifier having a gain of 2, in which the difference between the output voltage of the amplifier and a reference voltage is brought to the input of the amplifier which doubles it, each time, in recurrence, at successive clock instants, or else, if the output voltage does not exceed the said reference voltage, that output voltage itself is brought to the input of the amplifier.

The basic principle of the invention consists in counting, firstly in a counter, the number of repeated multiplications by 2 until the output voltage of the amplifier whose gain is 2 exceeds the reference voltage, then, starting from the first time the limit is exceeded, in continuing the multiplications by 2, subtracting the reference voltage each time the limit is exceeded, at the same time, a 1 is marked in a register each time the limit is exceeded and a 0 is marked in the register when the limit is not exceeded. At the end of the operation, the number displayed by the counter is the number of the section, and the data contained in the register provides a digital value corresponding to the position of the level on the section.

The invention will be described in detail with reference to the figures, which illustrate various embodiments, among which:

Figure 1:
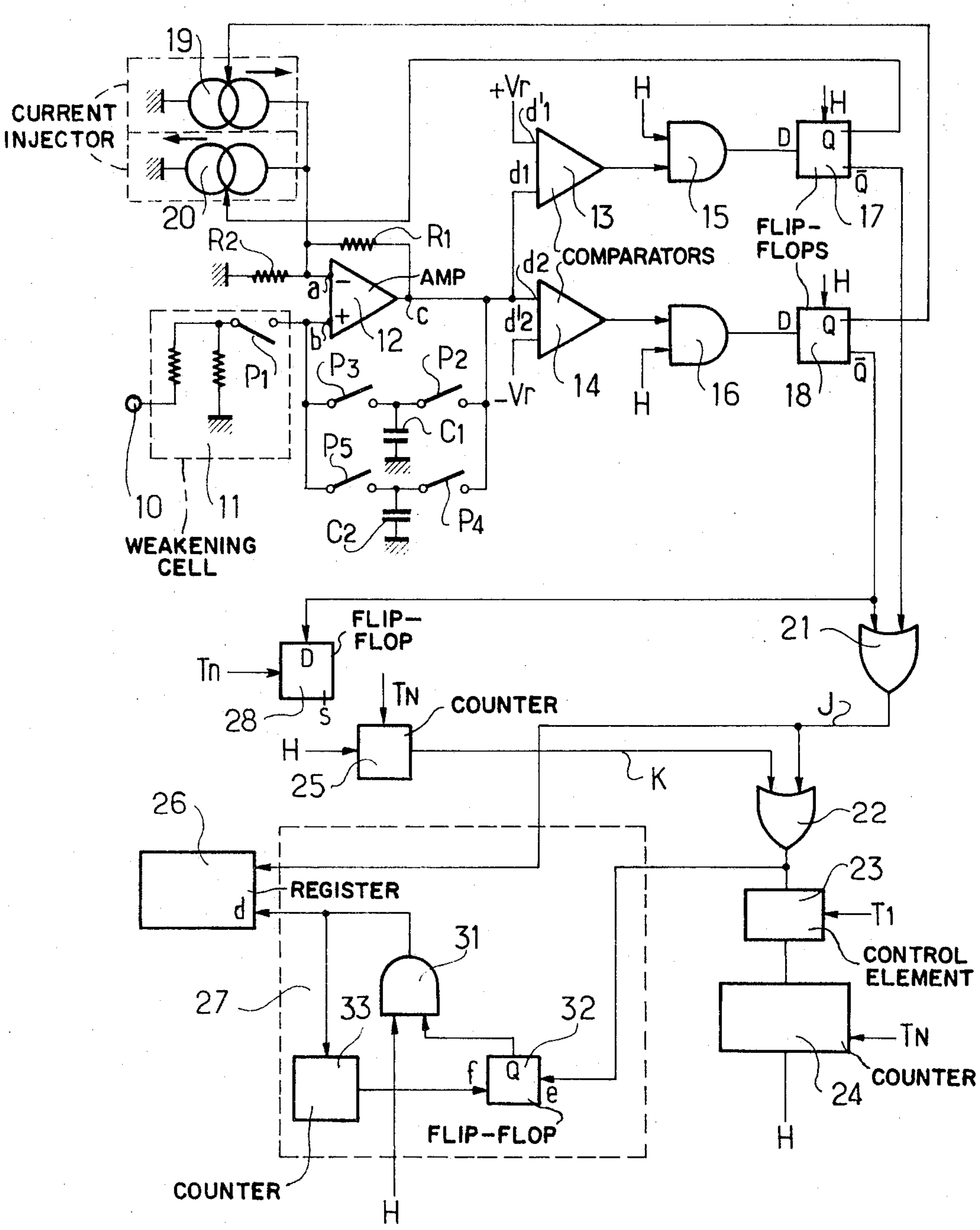
FIG. 1 shows a basic diagram.

Referring now to FIG. 1, a coder level is applied to an input terminal 10 to which a weakening cell 11 having a ratio of 1:2 is connected. There is provided an amplifier 12 having a gain of 2, which may, to great advantage, consist of an amplifier of the operational type having a − input terminal (*a*), a + input terminal (*b*), an output terminal *c* which is connected to the terminal a by a negative reaction resistor R1. The terminal a is connected to ground by a resistor R2.

The terminal *b* may be connected to the output of the weakening cell 11 by an analog gate P1, in conditions which will be specified herebelow.

A capacitor C1, having one terminal grounded, may be connected to the output *c* by an analog gate P2, or to the input *b* by an analog gate P3.

A capacitor C2, having one terminal grounded, may be connected to the output *c* by an analog gate P4 or to the input *b* by an analog gate P5.

The output *c* is connected to an input *d*1 of a comparator 13, another of whose inputs *d'*1 is connected to a reference voltage + V*r;* the output *c* is also connected to an input *d*2 of a comparator 14, another of whose inputs *d'*2 is connected to a reference voltage −V*r*.

The output of the comparator 13 supplies a logic signal which is transmitted by an AND gate 15, under the control of a clock pulse H, to the input of a bistable flip-flop 17, for example, a type D flip-flop. Likewise, the output of the comparator 14 is transmitted to the input of a type D flip-flop 18, by an AND gate 16.

The output terminals Q of the flip-flops 17 and 18 may transmit a starting up order to two current injectors 20 and 19 respectively. These current injectors may make a calibrated current pass from one polarity or the other, as shown by the two arrows in opposite directions, in the resistor R2. If the comparator 13 is subjected to the exceeding of the voltage +V*r* by a positive level, the current injector 19 applies to the terminal a of the amplifier 12, a voltage equal to +VR, which is subtracted from the voltage applied at *b*. If the comparator 14 is subjected to a phase difference (in modulus) of the voltage V*r* by a negative level, the current injector 20 applies, to the terminal *a*, a voltage equal to −V*r*, which is subtracted (in modulus) from the voltage applied at *b*.

This way of applying the voltage to be subtracted by a current injector is an advantage, due to the fact that, as a current injector has a very high internal impedance, the effective ohmic value of the resistor R2 is not altered by the starting of one of the current injectors, and the gain of the amplifier 12 remains equal to 2, with excellent precision.

The terminals $\bar{Q}$ of the bistable flip-flops 17 and 18 are connected to the inputs of an OR circuit 21.

A modulo 8 reverse counting counter 24 is energized by clock pulses H. That counter may be blocked or unblocked by a control element 23 of known type. The control element 23 may be incorporated in the counter 24, with access by a blocking terminal, as is currently the case in modern counters; or else it may consist of an AND gate allowing or preventing the arrival of the clock pulses H, according to whether it is open or closed.

The blocking of the counter 24 may be produced under the effect of a signal J coming from the OR circuit 21, or of a signal K coming from a modulo 8 counter 25, reset to zero by the clock instant TN, which will again be referred to herebelow. The signals J and K are transmitted to the blocking input of the element 23 by an OR circuit 22.

It will be seen herebelow that a complete coding cycle comprises N clock instants, where N>12 (for example N = 16), the clock instants being identified by T1, T2 ... TN.

The counter 24 is unblocked by an instant T1 applied in the unblocking state to the element 23.

The counter 24 is reset to the full capacity (111 in binary numbering) by the clock instant TN.

The signals J are also received by a shift register 26 having four divisions, which receives, on its advance line *d*, the pulses H, in certain conditions.

The register 26 receives four advance instants starting from the first signal J, which has blocked the counter 24. Then, at the end of these four instants, the contents of the register 26 do not change any more until the following coding cycle.

These functions are ensured by an element 27 which may comprise, for example, an AND gate 31 which receives, at one input, the clock pulses H, a bistable flip-flop 32 whose output is Q, having an input *e* and a terminal *f* for resetting to zero, and a modulo 4 counter, 33. In the rest position, the output Q of the bistable flip-flop 32 is at zero; the clock pulses H do not reach the advance line *d*, the contents of the register 26 remain unchanged. When the blocking element 23 receives the first pulse J of the coding cycle in progress via the OR gate 22, it sends an order to the input *e* of the bistable flip-flop 32; the AND gate 31 becomes conductive. At the same time, advance pulses coming from the gate 31 are received by the counter 33, which, on the fourth advance pulse received, brings the bistable flip-flop 32 back to zero by a pulse on the terminal *f*.

Within the scope of the invention, the element 27 could have another configuration ensuring an equivalent function.

The coder also includes a bistable flip-flop 28 which receives, on an input D a data element whose sign is that applied to the terminal $\bar{Q}$ of the flip-flop 18. That data is read during an instant T*n* (where n is comprised between 12 and N), and supplies, to the output terminal Q of the flip-flop 28, a bit whose sign is S.

At the first instant of a coding cycle (T1), the gates P1 and P2 are conductive: the level applied to the terminal 10, divided by 2 by the cell 11, is applied by the gate P1 to the input b of the amplifier 12, the output voltage at *c* is applied to the capacitor C1. At the second instant (T2), the gates P3 and P4, exclusive of the others, are conductive: the voltage memorized by the capacitor C1 is applied to the input *b*, the voltage at *c* is applied to the capacitor C2. At the third instant (T3), the gates P2 and P5, exclusive of the others, are conductive: the voltage memorized by C2 is applied at *b;* the voltage applied at *c* is memorized by C1; then, at the fourth instant (T4) the gates P3 and P4 are conductive, and so on, in alternation, until the end of the coding, which may last 12 instants at the most, as will be shown below.

The complete coding cycle takes a number of instants N, where N>12; for example, it will be assumed that N = 16. The last instants of the cycle are rest instants before the beginning of the following coding cycle.

OPERATION. The maximum value of the voltage to be coded is fixed at V*m* (+V*m* and −V*m*); for example, V*m* = 10 volts. The reference voltages of the comparators 13 and 14, +V*r* and −V*r* are equal to ±5 volts.

The levels at the input of the amplifier 12 whose gain is 2 possibly reaching the maximum value of 10 volts, the weakening cell 11 has the function of maintaining the output voltage of the amplifier 12 at a maximum of 10 volts.

At the first coding instant, the gate P1 applies to the input *b* of the amplifier 12 the input signal weakened by the cell 11. At each following clock instant, the tilting system of the gates P2 to P5 and the capacitors C1 and C2 have the effect of rearranging at the input of the amplifier 12 the function which existed at the output at the preceding clock instant.

During that time, the counter 24, which was positioned at (1,1,1) at the beginning of the cycle, counts backwards each time by one unit at each clock instant.

This process is continued until the first time one of the thresholds (+V*r* or −V*r*) is exceeded by the voltage at *c*, V*c* which results in the emission of a pulse J. At that time (instant T*i*) the blocking element 23 stops the operation of the counter. The value ABC displayed by the counter 24 indicates the order of the section.

From that time, the register 26 is unblocked; the data J which is applied to the input transists through the register at each following clock instant T*j*. At the instant T (*j*+1) the voltage (V*r*) is subtracted from the input signal of the amplifier 12, the process of multiplying by 2 is continued, but from that time onwards, each time V*c* exceeds V*r*, the voltage V*r* is subtracted from V*c* by the starting of a current injector 19 or 20; at the same time, a 1 is applied to the input of the register 26. If limits are not exceeded, there is no starting of a current injector; at the same time, a 0 is applied to the input of the register 26.

The coding of the number of the section may last for a clock instant (level on section *n*° 7 in accordance with the compression law), ... up to eight clock instants for a level on the lowest section, whose order is 0.

In the latter case, at the eighth clock instant, the reference level V*r* has not been exceeded. Nevertheless, it is necessary to stop the counter 24. This function is assumed by the counter 25.

The coding of the position on the section supplies four bits D, E, F, G in four clock instants.

The complete coding therefore lasts for a time comprised between a minimum of five clock instants and a maximum of 12 clock instants.

The sign of the input level is read at the end of the coding: that sign is known when a reference level ±V*r* is exceeded for the first time. If the level to be coded is on the lowest section (section n° 0), this level will be exceeded on one of the last instants T9, T10, T11, T12. The sign data is therefore transferred to the flip-flop 28 at an instant T*n*, *n* being comprised between 12 and N (for example N = 16).

If the level to be coded is less than the first step of the section *n*°0, the reference voltage has not been exceeded: there is therefore no sign data; the flip-flop 28 actually displays a value, 0 or 1, but that value corresponds to the polarity of the preceeding sample. That uncertainty concerning the polarity of a level lower than the lowest step does not cause any disturbance in the transmission, since the level is considered as zero in the quantification. The various clock instants are supplied from a central clock by known devices such as decoders connected with a counter or an equivalent element.

EXAMPLES

It is assumed that the reference voltage of the comparators is V*r* = ±5 volts.

1. The input level to be coded is 2 V.

At the instant T3, the result obtained is V*c* = 8V, greater than Va; this is the end of the coding of the section. The counter 24 displays A = 1, B = 0, C = 1.

At the following instants, the values found for Vc are as below:

| T4 | T5 | T6 | T7 |
|---|---|---|---|
| Vc(8−5) · 2=6 | (6−5)· 2=2 | 2· 2=4 | 4· 2=8 |

The position bits resulting therefrom are: D = 1, E = 0, F = 0, G = 1.

2. The input level to be coded is 0.030V.

At the instant T8, the result obtained is $Vc = 3.84V$. The reference voltage $Vr$ has not been exceeded. The counter 24 is blocked by the position 8 of the counter 25. The counter 24 displays A = B = C = 0.

At the following instants the values found for Vc are as below:

| | T9 | T10 | T11 | T12 |
|---|---|---|---|---|
| Vc | 7.68 | (7.68–5)·2=5.36 | (5.36–5)·2:0.72 | 1.44 |

The position bits resulting therefrom are: D = 1, E = 1, F = 0, G = 0.

Figure 2:
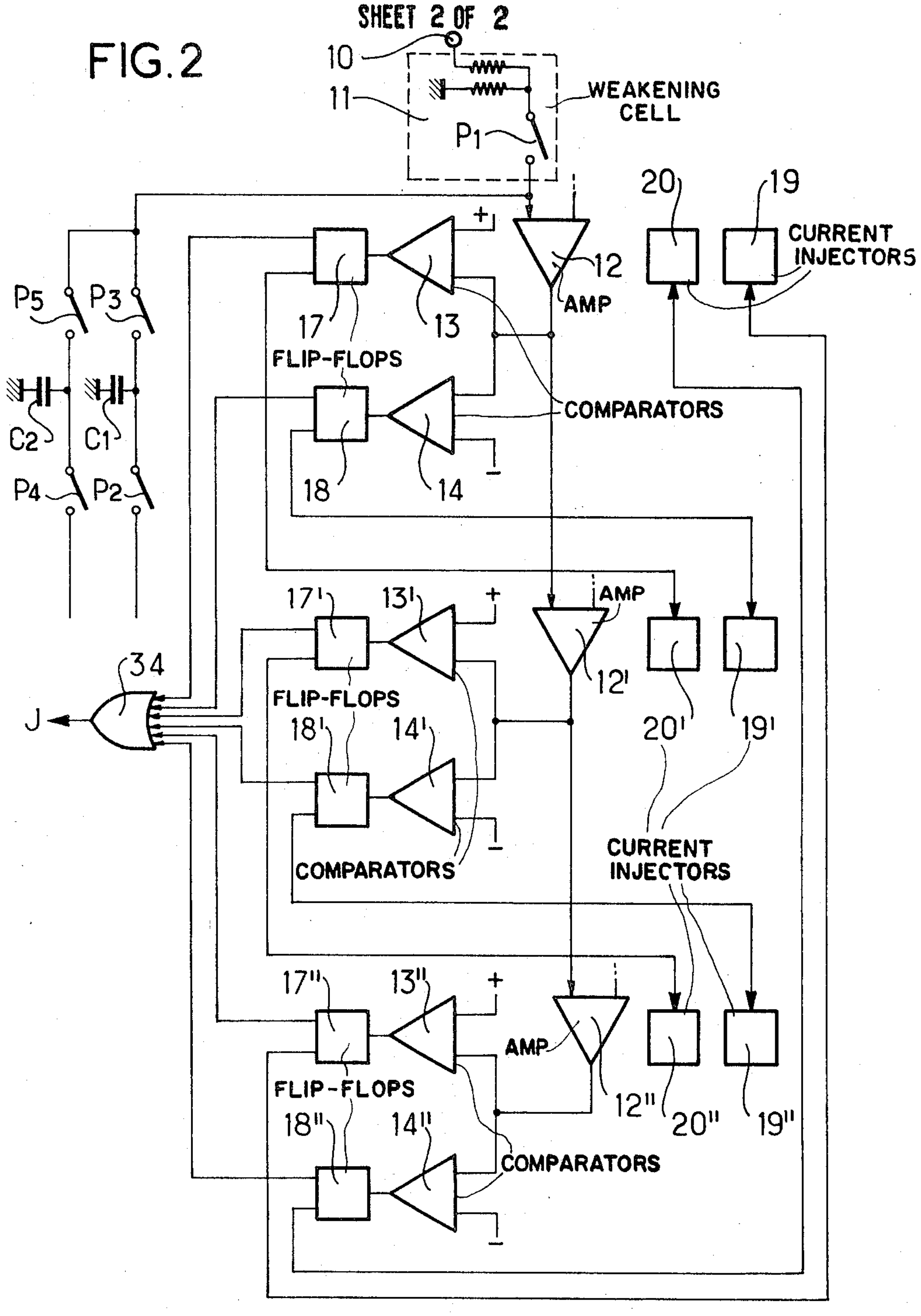
FIG. 2 is the diagram of a particular embodiment which enables faster operation of the coder.

In FIG. 1 as in FIG. 2, the assigning of the various clock instants to the various elements is effected by well-known means, which have not been illustrated.

The convertor of the invention may be adapted to a linear coding: in a simplified version, it is sufficient not to install the counter 24 and the logic circuits connected with it.

FIG. 2. FIG. 2 shows, in a simplified way another embodiment of the input circuit of the device which, at the cost of a greater expense in components, makes it possible to obtain a higher speed than with the arrangement in FIG. 1.

According to the diagram in FIG. 2, several amplifiers identical to the amplifier 12 in FIG. 1 are connected in series, each amplifier being provided with two comparators, two flip-flops and two current injectors.

On keeping exclusively the elements which are essential for illustrating the differences in this circuit diagram, there is shown the amplifier 12, provided with the comparators 13, 14 the flip-flops 17, 18 the current injectors 19, 20, are left. A second amplifier 12′, provided with identical elements 13′, 14′, 17′, 18′, 19′, 20, is connected in series with the amplifier 12.

An amplifier 12″, provided with the elements 13″, 14″, 17″, 18″, 19″, 20″ is connected in series with the amplifier 12′. The injectors of the first stage are controlled by the flip-flops 17″, 18″ of the third stage; the injectors 19′, 20′, of the second stage are controlled by the flip-flops 17, 18 of the first stage; the injectors 19″, 20″ of the third stage are controlled by the flip-flops 17′, 18′, of the second stage.

The analog gates P1, P3, P5 are connected to the input of the amplifier 12, in the same way as in FIG. 1. The gates P2 and P4 are connected to the output of the amplifier 12″. The gates P1 to P5 are connected to the capacitors C1 and C2 in the same way as in FIG. 1.

The flips-flops 17, 18, 17′, 18′, 17″, 18″, each have an output connected to an input of an OR circuit 34, which may supply, at the output, a signal J.

The flip-flops are not "read" at each clock instant, as in the diagram according to FIG. 1, but one instant in three: those of the first stage, 17, 18 at the instants T1, T4, T7, etc; those of the second stage, 17′, 18′, at the instants T2, T5, T8, etc; those of the third stage 17″, 18″, at the instants T3, T6, T9, etc. The injectors, controlled by the flip-flops, operate at a slow rate in relation to the clock. Likewise, the reversing operations of the gates, P3, P5 and P2, P4, occur one clock time in three. This configuration therefore allows a faster clock rate than the configuration in FIG. 1.

Obviously, many modifications and variations of the present invention are possible in the light of the above teachings. It should therefore be understood that within the scope of the appended claims, the invention may be practiced otherwise than as specifically described.

What is claimed:

1. An analog-to-digital convertor of the re-circulating type for compression law coding having a coding characteristic formed by n sections whose successive slopes decrease according to binary law, comprising clock means for supplying clock pulses, at least one amplifier having a gain of 2 for amplifying a level to be coded applied to an input of the amplifier, first threshold comparator means connected to said amplifier for comparing amplified positive levels to be coded with a predetermined threshold and providing an output indicative thereof, second threshold comparator means connected to said amplifier for comparing amplified negative levels to be coded with a predetermined threshold and providing an output indicative thereof, said first and second threshold comparator means having an operating rhythm controlled by the clock pulses, counter means for counting clock pulses starting with an original pulse, shift register means, and logic switching means for controlling the application of clock pulses to said counter means and to said shift register means, said logic switching means being responsive to an output of said first or second threshold comparator means indicating that a threshold has been exceeded for a first time for blocking the counting of pulses by said counter means and for enabling the application of clock pulses to said shift register means, wherein the complete coding is formed by a first series of bits supplied by said counter means indicating the order of the section of the coding characteristic and a second series of bits supplied by said shift register means indicating the position of the level of the section.

2. A convertor according to claim 1, wherein said first and second threshold comparator means provide a logic output of 1 when the threshold is exceeded and a logic output of 0 when the threshold is not exceeded.

3. A convertor according to claim 1, wherein said first threshold comparator means includes a first output bistable flip-flop and said second threshold comparator means includes a second output bistable flip-flop, the output of said first or second bistable flip-flops being connected to an input of a third bistable flip-flop providing an output indicative of the sign of the level to be coded, starting from the first time the threshold is exceeded.

4. A convertor according to claim 3, further comprising two current injectors having high internal resistance, one for each polarity level to be coded, each of said current injectors being responsive to an output of one of said first and second bistable flip-flops for passing a calibrated current to said amplifier via an input resistor having a much lower ohmic value than the internal resistance of said current injectors.

5. A convertor according to claim 4, wherein the level to be coded is applied to an input terminal of said amplifier via current weakening means having a ratio of 1:2 connected in series with a first analog gate connected to said input terminal of said amplifier.

6. A convertor according to claim 5, further comprising second, third, fourth and fifth analog gates, said amplifier having the input thereof connected to said third and fifth gates and the output thereof connected to said second and fourth gates, said second and third gates having a common junction point and a first capacitor being connected to said common junction point of said second and third gates, said fourth and fifth gates having a common junction point and a second capacitor being connected to said common junction point of said fourth and fifth gates, and logic means for establishing conductive paths at successive clock instants for rendering only the first and second gates conductive at the first clock instant and for alternately rendering only the third and fourth gates and then only the second and fifth gates conductive in accordance with succeeding clock instants.

7. A convertor according to claim 6, wherein said logic switching means includes first logic means for blocking the input of the counter at the first clock instant corresponding to the first time the threshold is exceeded and second logic means for opening the access of the shift register means for a predetermined number of clock instants.

8. A convertor according to claim 7, wherein said shift register means is opened for access for four clock instants for four bits.

9. A convertor according to claim 7, wherein said logic switching means includes blocking logic means for blocking said counter means at a predetermined clock instant if said counter means has not been previously blocked.

10. An analog-to-digital convertor of the recirculating type for compression law coding having a coding characteristic formed by n sections whose successive slopes decrease according to binary law, comprising clock means for supplying clock pulses, a plurality of amplifier-comparator stages, each of said amplifier-comparator stages having an amplifier having a gain of two for amplifying a level to be coded applied to the input of the amplifier, the amplifiers of the plurality of stages being connected in series such that the output of the amplifier of the preceding stage is applied to the input of the amplifier of the succeeding stage, each of the stages including a first threshold comparator means connected to the output of the amplifier of the respective stage for comparing amplified positive levels to be coded with a predetermined threshold and providing an output indicative thereof, second threshold comparator means connected to the output of the amplifier of the respective stage for comparing amplified negative levels to be coded with a predetermined threshold and providing an output indicative thereof, the first and second threshold comparator means of each stage having an operating rhythm controlled by the clock pulses, the convertor further including counter means for counting clock pulses starting with an original pulse, shift register means, and logic switching means for controlling the application of clock pulses to the counter means and to the shift register means, the logic switching means being responsive to an output of the first or second threshold comparator means from one of the stages indicating that a threshold has been exceeded for a first time for blocking the counting of pulses by the counter means and for enabling the application of clock pulses to the shift register means, wherein the complete coding is formed by a first series of bits supplied by the counter means indicating the order of the section of the coding characteristic and a second series of bits supplied by the shift register means indicating the position of the level of the section.

11. A convertor according to claim 10, wherein each comparator means of each stage is provided with an output bistable flip-flop, and each stage further includes two current injectors having high internal resistance, one for each polarity level to be coded, each of the current injectors being arranged for passing a calibrated current to the amplifier of the respective stage via an input resistor having a much lower ohmic value than the internal resistance of the current injectors, the current injectors of the second stage being controlled by the bistable flip-flops of the first stage and the current injectors of the next succeeding stage being controlled by the bistable flip-flops of the previous stage with the current injectors of the first stage being controlled by the bistable flip-flops of the last stage.

12. A convertor according to claim 11, wherein an input level to be coded is applied to an input terminal of the amplifer of the first stage via current weakening means having a ratio of 1:2 connected in series with a first analog gate connected to the input terminal of the amplifier.

13. A convertor according to claim 12, further comprising second, third, fourth and fifth analog gates, the amplifier of the first stage having the input thereof connected to the third and fifth gates and the amplifier of the last stage having the output thereof connected to the second and fourth gates, the second and third gates having a common junction point and a first capacitor being connected to the common junction point of the second and third gates, the fourth and fifth gates having a common junction point and a second capacitor connected to the common junction point of the fourth and fifth gates.

* * * * *